US006921964B2

United States Patent
Furuhata et al.

(10) Patent No.: US 6,921,964 B2
(45) Date of Patent: Jul. 26, 2005

(54) SEMICONDUCTOR DEVICE HAVING A NON-VOLATILE MEMORY TRANSISTOR FORMED ON A SEMICONDUCTOR

(75) Inventors: Tomoyuki Furuhata, Sakata (JP); Kotaro Misawa, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/072,658

(22) Filed: Feb. 7, 2002

(65) Prior Publication Data

US 2002/0135012 A1 Sep. 26, 2002

(30) Foreign Application Priority Data

Feb. 8, 2001 (JP) .......................... 2001-032069
Jan. 30, 2002 (JP) .......................... 2002-021025

(51) Int. Cl.$^7$ .............................................. H01L 29/78
(52) U.S. Cl. .................... 257/637; 257/649; 257/760
(58) Field of Search ............................... 257/632–651, 257/758–760

(56) References Cited

U.S. PATENT DOCUMENTS

| 5,077,238 A | * | 12/1991 | Fujii et al. ................... 438/624 |
| 5,376,590 A | * | 12/1994 | Machida et al. ............. 438/763 |
| 5,888,910 A | * | 3/1999 | Park ............................ 438/783 |
| 6,008,517 A | * | 12/1999 | Wu ............................. 257/321 |
| 2001/0002713 A1 | * | 6/2001 | Goda et al. ................. 257/315 |

FOREIGN PATENT DOCUMENTS

| GB | 2305295 A | * 4/1997 | ......... H10L/21/316 |
| JP | 56-049570 | 5/1981 | |
| JP | 62-188375 | 8/1987 | |
| JP | 04-273168 | 9/1992 | |
| JP | 04-287365 | 10/1992 | |
| JP | 08-222633 | 8/1996 | |
| JP | 09-162389 | 6/1997 | |
| JP | 10-154792 | 6/1998 | |
| JP | 2000-216273 | 8/2000 | |

OTHER PUBLICATIONS

Communication from Japanese Patent Office re: counterpart application.

* cited by examiner

Primary Examiner—Howard Weiss
Assistant Examiner—Marcos D. Pizarro
(74) Attorney, Agent, or Firm—Harness, Dickey & Pierce, P.L.C.

(57) ABSTRACT

A semiconductor device includes a non-volatile memory transistor 100. An interlayer dielectric layer 40 is provided on a semiconductor layer 10 where the non-volatile memory transistor 100 is formed. The interlayer dielectric layer 40 is an insulation layer for electrically isolating a conductive layer 30 formed over the semiconductor layer 10 from the non-volatile memory transistor, and includes a layer 42 containing nitride.

5 Claims, 12 Drawing Sheets

SEMICONDUCTOR DEVICE HAVING A NON-VOLATILE MEMORY TRANSISTOR FORMED ON A SEMICONDUCTOR

TECHNICAL FIELD

The present invention relates to a semiconductor device including a memory transistor and a method for manufacturing the same.

BACKGROUND TECHNOLOGY

A split-gate type non-volatile memory transistor and a stacked type non-volatile memory transistor are known as those of the devices that are applied to an electrically erasable programmable ROM (EEPROM). One example of a semiconductor device including a split-gate type non-volatile memory transistor will be described below. FIG. 18 schematically shows a cross-sectional view of one example of a conventional semiconductor device including a split-gate type non-volatile memory transistor.

A split-gate type memory transistor 300 has, in the case of an N-type transistor as an example, a source region 14 and a drain region 16 composed of $N^+$-type impurity diffusion layers formed in a silicon substrate 10 of P-type, and a first dielectric layer 70 as a gate insulation layer formed on a surface of the silicon substrate 10. A floating gate 72, a second dielectric layer 76 and a control gate 78 are successively formed on the first dielectric layer 70.

A third dielectric layer 74 is formed on the floating gate 72. The third dielectric layer 74 is composed of a dielectric layer that is formed by selectively oxidizing part of a polysilicon layer that becomes to be the floating gate 72. In other words, the third dielectric layer 74 has a structure in which the film thickness thereof becomes thinner from its center toward both of its end sections, as shown in FIG. 18. As a result, upper edge sections 720 of the floating gate 72 form sharp edges, such that an electric field concentration is apt to occur at the upper edge sections 720. An interlayer dielectric layer 240 is formed on the silicon substrate 10. The interlayer dielectric layer 240 is generally composed only of a silicon oxide layer. A through hole 246 is formed in a specified region of the interlayer dielectric layer 240. The through hole 246 is filled with a conductive material to form a contact layer 32. A wiring layer 30 that is electrically connected to the contact layer 32 is formed on the interlayer dielectric layer 240.

For the operation of the memory transistor with a split-gate structure 300, a channel current is flown between the source region 14 and the drain region 16 to thereby inject a charge (hot electrons) in the floating gate 72 as indicated by an arrow A10 when data is written. When data is erased, a predetermined high voltage is applied to the control gate 78 to thereby transfer the charge stored in the floating gate 72 through the second dielectric layer 76 to the control gate 78 as indicated by an arrow B10 by Fowler-Nordheim tunneling conduction (FN conduction).

It is an object of the present invention to provide a semiconductor device having a non-volatile memory transistor in which the characteristic stability of the non-volatile memory transistor is improved, and also a method for manufacturing the same.

[Disclosure of The Invention]

A semiconductor device in accordance with a first embodiment of the present invention includes a non-volatile memory transistor, and an interlayer dielectric layer provided on a semiconductor layer in which the non-volatile memory transistor is formed, wherein the interlayer dielectric layer is an insulation layer for electrically isolating the non-volatile memory transistor from a conductive layer formed over the semiconductor layer, and the interlayer dielectric layer includes a layer containing nitride.

In the semiconductor device in accordance with the first embodiment of the present invention, the interlayer dielectric layer includes a layer containing nitride. For this reason, the non-volatile memory transistor can be protected from process induced charges that are generated in various manufacturing steps after the interlayer dielectric layer has been formed. As a result, for example, FTV (Forward Tunnel Voltage), FTUR (Forward Trap Up Rate) and the rewritable number (Endurance) characteristic of the non-volatile memory transistor can be improved.

In the semiconductor device in accordance with embodiments of the present invention, preferably, the layer containing nitride may take at least one of the following embodiments 1) and 2).

1) The layer containing nitride can assume an embodiment in which the layer containing nitride is provided as a lowermost layer of the interlayer dielectric layer, an embodiment in which the same is provided as an uppermost layer of the interlayer dielectric layer, or an embodiment in which the same is provided as an intermediate layer of the interlayer dielectric layer.

2) The nitride may be at least one of silicon nitride and silicon oxide nitride.

In the semiconductor device in accordance with embodiments of the present invention, more preferably, the layer containing nitride may take at least one of the following embodiments 1) and 2).

1) An embodiment in which the non-volatile memory transistor includes a floating gate disposed over the semiconductor layer through a gate dielectric layer, a tunneling dielectric layer that contacts at least a part of the floating gate, a control gate that is formed over the tunneling dielectric layer, and source region and drain region formed in the semiconductor layer.

2) An embodiment in which the non-volatile memory transistor includes a floating gate disposed over the semiconductor layer through a gate dielectric layer, a control gate disposed over the floating gate through an intermediate dielectric layer, and source region and drain region formed in the semiconductor layer.

A semiconductor device in accordance with another embodiment of the present invention is a semiconductor device that includes a non-volatile memory transistor formed on a semiconductor layer, and includes an interlayer dielectric layer provided over the semiconductor layer and the non-volatile memory transistor, wherein the interlayer dielectric layer includes an oxide film provided as a lowermost layer of the interlayer dielectric layer and a layer containing nitride provided on the oxide film.

In the embodiment of the present invention, the oxide film may preferably have a thickness of 10–80 nm. Furthermore, due to the fact that the thickness of the oxide film is in a range of 30–70 nm, the characteristics required in view of the rewritable number can be secured, and the memory characteristic can be stabilized by suppressing the amount of changes in the threshold voltage of the control gate.

In accordance with an embodiment of the present invention, more preferably, the oxide film may be an oxide film that is formed by a reduced pressure CVD method using TEOS.

A method for manufacturing a semiconductor device in accordance with an embodiment of the present invention includes the following steps.

(a) A step of forming a non-volatile memory transistor in a semiconductor layer, and (b) A step of forming an interlayer dielectric layer over the semiconductor layer in which the non-volatile memory transistor, wherein the interlayer dielectric layer is an insulation layer for electrically isolating a conductive layer formed over the semiconductor layer from the non-volatile memory transistor, and the interlayer dielectric layer includes a layer containing nitride.

In the method for manufacturing a semiconductor device in accordance with the embodiment of the present invention, the layer containing nitride and the non-volatile memory transistor can assume embodiments that are the same as those of the semiconductor device in accordance with the embodiment of the present invention.

Here, the "semiconductor layer" described above includes a semiconductor substrate and a semiconductor layer formed on a substrate.

PREFERRED EMBODIMENTS OF THE INVENTION IN BEST MODE

Preferred embodiments of the present invention will be described below with reference to the accompanying drawings.

(First Embodiment)

Figure 1:
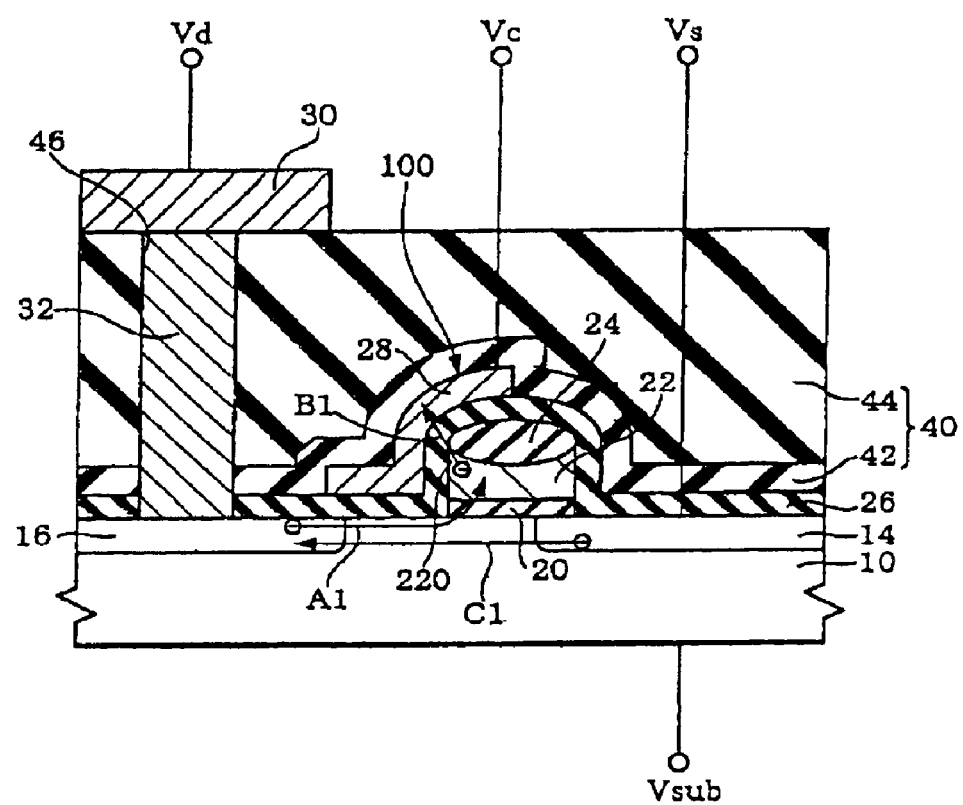
FIG. 1 schematically shows a cross-sectional view of a semiconductor device in accordance with a first embodiment of the present invention.

A semiconductor device in accordance with a first embodiment is described below. FIG. 1 schematically shows a cross-sectional view of a semiconductor device in accordance with the first embodiment of the present invention.

The semiconductor device includes a non-volatile memory transistor having a split-gate structure (hereafter referred to as a "memory transistor") 100. The memory transistor 100 has a source region 14, a drain region 16 and a gate dielectric layer 20. The source region 14 and the drain region 16 are composed of $n^+$-type impurity diffusion layers formed in a silicon substrate 10 of P-type, in the case of an n-type transistor as an example. The gate dielectric layer 20 is formed on a surface of the silicon substrate 10.

A floating gate 22, a tunneling dielectric layer 26, and a control gate 28 are successively formed on the gate dielectric layer 20.

An upper dielectric layer 24 is formed on the floating gate 22. The upper dielectric layer 24 has a structure in which the thickness thereof becomes thinner from its center toward its end sections. As a consequence, both upper sections of peripheral sections 220 of the floating gate 22 form sharp edges. As a result, electric field concentration is apt to occur at the upper peripheral sections 220.

The tunneling dielectric layer 26 is formed in a manner to cover the upper dielectric layer 24, the floating gate 22 and the silicon substrate 10.

A control gate 28 is formed on an upper surface of the tunneling dielectric layer 26. A silicide layer (not shown) may be formed depending on the requirements on the control gate 28. Tungsten silicide, molybdenum silicide, titanium silicide, and cobalt silicide can be listed as a material for the silicide layer.

Further, an interlayer dielectric layer 40 is formed over the wafer where the memory transistor 100 is formed. A layer 42 containing nitride is provided at the lower most layer of the interlayer dielectric layer 40. A silicon oxide layer 44 that composes part of the interlayer dielectric layer 40 is formed on the layer 42 containing nitride. Silicon nitride and silicon nitride oxide may be listed as the nitride. The thickness of the layer 42 containing nitride may be, for example, 50–100 nm, and preferably 50–70 nm.

For example, a contact hole 46 that reaches the drain region 16 is formed in the interlayer dielectric layer 40. A contact layer 32 is formed in the contact hole 46. The contact layer 32 is formed from, for example, a tungsten plug. A wiring layer 30 having a specified pattern is formed on the contact layer 32 and the interlayer dielectric layer 40.

Next, a method for operating the memory transistor 100 that composes the semiconductor device in accordance with one example of the present embodiment will be described with reference to FIG. 1.

Referring to FIG. 1, Vc indicates a voltage applied to the control gate 28, Vs indicates a voltage applied to the source region 14, Vd indicates a voltage applied to the drain region 16, and Vsub indicates a voltage applied to the P-type silicon substrate 10.

For the operation of the memory transistor 100 having a split-gate structure, a channel current is flown between the source region 14 and the drain region 16 to thereby inject a charge (hot electrons) in the floating gate 22 when data is written. When data is erased, a predetermined high voltage is applied to the control gate 28 to thereby transfer the charge stored in the floating gate 22 to the control gate 28 by FN conduction. Each of the operations in one example will be described below.

First, the data-writing operation will be described. It is noted that an arrow A1 indicates a flow of electrons at the time of writing.

For the data-writing operation, the source region 14 is set at a higher potential with respect to the drain region 16, and a specified potential is applied to the control gate 28 depending on the requirements. As a result, hot electrons that are generated near the drain region 16 are accelerated toward the floating gate 22, and injected in the floating gate 22 through the gate dielectric layer 20 whereby data is written.

In the data-writing operation, for example, the control gate 28 is set at a potential (Vc) of 2V, the source region 14 is set at a potential (Vs) of 10.5V, and the drain region 16 is set at a potential (Vd) of 0.8V. Also, the silicon substrate 10 is set at a potential (Vsub) of 0V.

Next, the data-erasing operation will be described. It is noted that an arrow B1 indicates a flow of electrons at the time of erasing.

For the data-erasing operation, the control gate 28 is set at a potential higher than the potential of the source region 14 and the drain region 16. As a result, the charge stored in the floating gate 22 is discharged from the sharp upper peripheral section 220, passing through the tunnel dielectric layer 26, to the control gate 28 due to FN conduction, whereby the data is erased.

In the data-erasing operation, for example, the control gate 28 is set at a potential (Vc) of 11.5V, the source region 14 and the drain region 16 are set at potentials (Vs) and (Vd) of 0V, respectively. The silicon substrate 10 is set at a potential (Vsub) of 0V.

Next, the data-reading operation will be described. It is noted that an arrow C1 indicates a flow of electrons at the time of reading.

For the data-reading operation, the drain region 16 is set at a high potential with respect to the source region 14, and a predetermined potential is applied to the control gate 28, whereby a determination is made whether or not data is written based on the presence or the absence of a formed channel.

More specifically, when a charge is injected in the floating gate 22, the potential of the floating gate 22 becomes low, with the result that a channel is not formed and a drain current does not flow. Conversely, when the floating gate 22 is not injected with a charge, the floating gate 22 has a high potential, with the result that a channel is formed and a drain current flows. By detecting a current flowing from the drain region 16 by a sense amplifier, data in the memory transistor 100 can be read out.

In the data-reading operation, for example, the control gate 28 is set at a potential (Vc) of 3.0V, the source region 14 is set at a potential (Vs) of 0V, and the drain region 16 is set at a potential (Vd) of 1V. The silicon substrate 10 is set at a potential (Vsub) of 0V.

Effects of the semiconductor device in accordance with the present embodiment are described below.

In the present embodiment, the interlayer dielectric layer 40 includes the layer 42 containing nitride. For this reason, the non-volatile memory transistor 100 can be protected from process induced charges that are generated in various manufacturing steps after the interlayer dielectric layer 40 has been formed. Also, the tunneling dielectric layer 26 can be protected from molecules and ions of hydrogen or the like that deteriorate the tunneling dielectric layer 26. As a result, FTM, FTUR, and the rewritable number characteristic of the memory transistor 100 can be improved.

Figure 2:
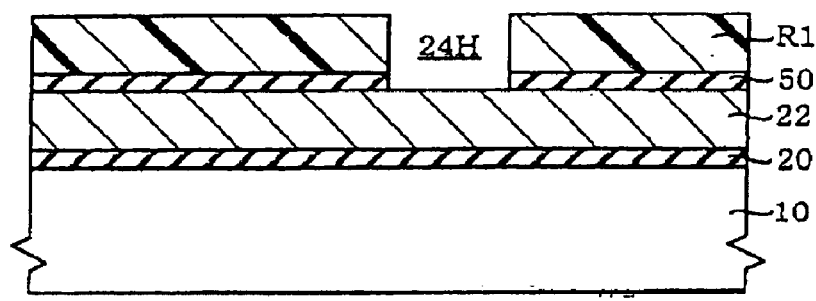
FIG. 2 shows in cross section steps of manufacturing the semiconductor device in accordance with the first embodiment of the present invention.
Figure 2:
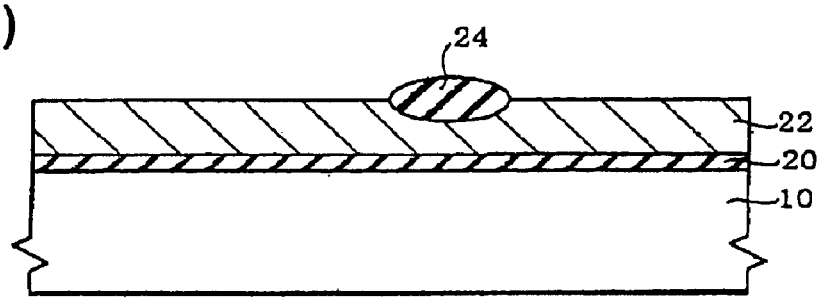
Figure 2:
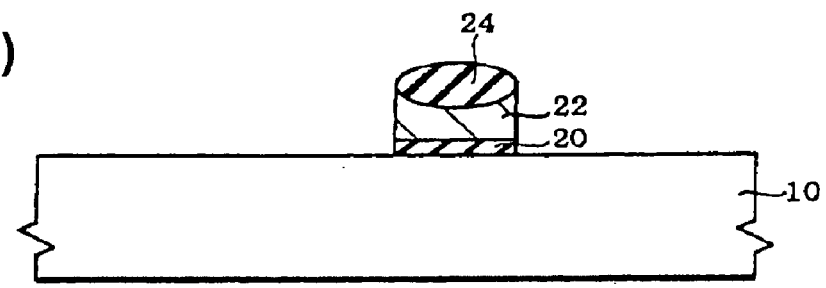
Figure 3:
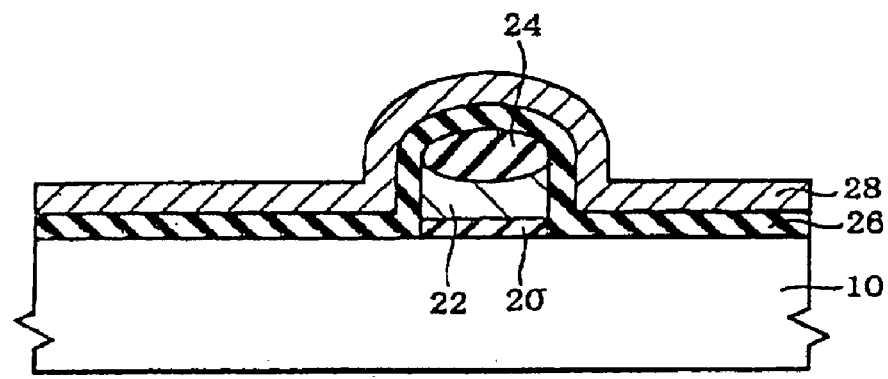
FIG. 3 shows in cross section steps of manufacturing the semiconductor device in accordance with the first embodiment of the present invention.
Figure 3:
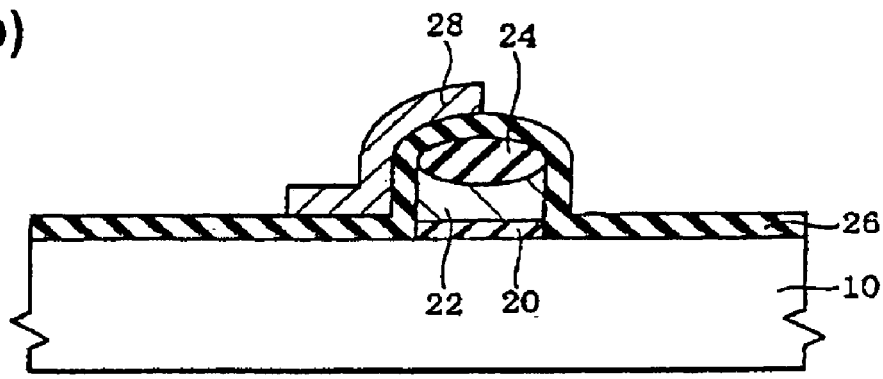
Figure 4:
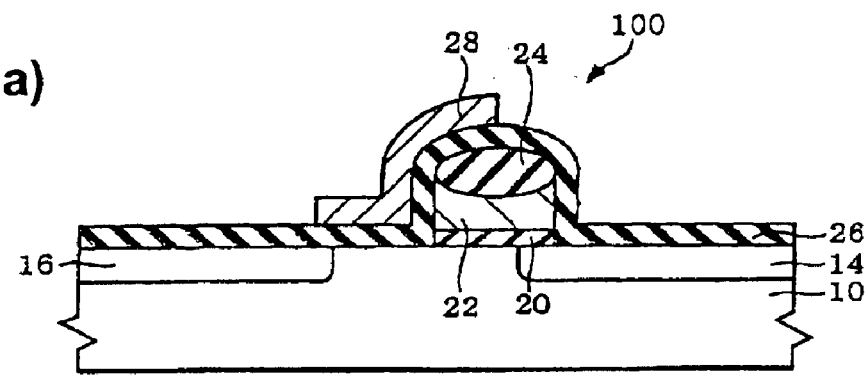
FIG. 4 shows in cross section steps of manufacturing the semiconductor device in accordance with the first embodiment of the present invention.
Figure 4:
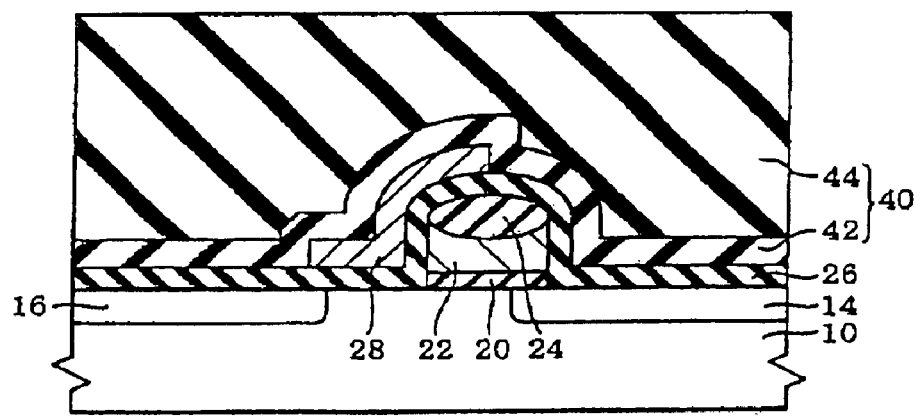

A method for manufacturing the semiconductor device in accordance with one embodiment of the present invention will be described. FIGS. 2 through 4 schematically show cross sections of a semiconductor device in manufacturing steps in accordance with the present embodiment.

(A) First, as shown in FIG. 2(a), a silicon oxide layer (gate dielectric layer) 20 is formed on a surface of the silicon substrate 10 by a thermal oxidation method. The silicon oxide layer 20 is not limited to a specific thickness, but may preferably have a thickness of 7–9 nm in view of the gate dielectric strength, the data retaining characteristic and the like.

Next, a polysilicon layer 22 is formed on a surface of the silicon oxide layer 20, and phosphorous or arsenic is diffused in the polysilicon layer 22 to form an n-type polysilicon layer 22. The method for forming the polysilicon layer 22 is not particularly limited, and a CVD method may be used, for example. The polysilicon layer 22 may preferably be formed to have a thickness of, for example, 50–300 nm, and preferably, 100–200 nm.

The polysilicon layer 22 may be changed to n-type by other methods. For example, after the polysilicon layer 22 is formed, phosphorous ions or arsenic ions are implanted therein. Alternatively, after the polysilicon layer 22 is formed, it is contacted with a carrier gas containing phosphoryl chloride ($POCl_3$). Alternatively, when the polysilicon layer 22 is formed, it is contacted with a carrier gas containing phosphine ($PH_3$).

Then, a silicon nitride layer 50 is formed on a surface of the polysilicon layer 22 by, for example, a CVD method. Next, using a lithography technique, specified regions of the silicon nitride layer 50 are selectively etched and removed. A region 24H of the silicon nitride layer 50 that is removed is a region where an upper dielectric layer 24 of the memory transistor 100 is formed.

(B) Next, as shown in FIG. 2(b), an exposed portion of the polysilicon layer 22 is selectively oxidized to form an upper dielectric layer 24 on a surface of the polysilicon layer 22 in a specified region thereof. The upper dielectric layer 24 formed by the selective oxidation has a structure in which it has a maximum film thickness at its central area, and gradually becomes thinner toward end sections thereof. Thereafter, the silicon nitride layer 50 is removed.

(C) Then, as shown in FIG. 2(c), the polysilicon layer 22 is selectively etched using the upper dielectric layer 24 as a mask. Further, the silicon oxide layer 20 on the silicon substrate 10 is removed.

(D) Next, as shown in FIG. 3(a), a silicon oxide layer (tunneling dielectric layer) 26 is deposited on the entire surface. The thickness of the silicon oxide layer 26 is, for example, 20–25 nm. The silicon oxide layer 26 may be formed by any method without being limited to a particular one. For example, a thermal oxidation method or a CVD method may be listed. A preferred CVD method is a high-temperature CVD method (for example, a silane-base high-temperature CVD method). Forming the silicon oxide layer 26 by a high-temperature CVD method provides an advantage in that the film density of the silicon oxide layer 26 becomes high.

Also, the silicon oxide layer 26 may be formed from a plurality of layers stacked in layers. More concretely, the silicon oxide layer 26 may have a stacked layered structure including a first silicon oxide layer obtained by a thermal oxidation method and a second silicon oxide layer obtained by a CVD method. Further, the silicon oxide layer 26 may preferably be formed to have a three-layer structure including a first silicon oxide film obtained by a thermal oxidation method, a second silicon oxide film obtained by a high-temperature CVD method, and a third silicon oxide film obtained by a thermal oxidation method. By forming the first and third silicon oxide films that contact the floating gate 22 and the control gate 28, respectively, by a thermal oxidation method, there are advantages in that the interface level of the floating gate 22 and the control gate 28 stabilizes, and the erasing operation characteristic stabilizes. Also, when an oxide film that is obtained by a thermal CVD method is formed between the first and second silicon oxide films, there is an advantage in that a film thickness required for the silicon oxide layer that functions as a tunneling dielectric layer can be secured with a high controllability.

Next, a polysilicon layer 28 is formed on a surface of the silicon oxide layer 26. The method for forming the polysilicon layer 28 is not particularly limited, and a CVD method may be used, for example. The polysilicon layer 28 can be turned into n-type by the same method used for the polysilicon layer 22 described above. The polysilicon layer 28 may have a film thickness of, for example, 50–300 nm.

Next, depending on the requirements, a silicide layer (not shown) is formed on the polysilicon layer 28. The silicide layer can be formed by, for example, a sputter method or a CVD method.

Next, a resist layer (not shown) having a specified pattern is formed on the control gate 28. Then, the polysilicon layer 28 is selectively etched, using a lithography technique, as shown in FIG. 4(*a*).

(E) Next, an n-type impurity is doped in the silicon substrate 10 by a known method to thereby form a source region 14 and a drain region 16. The steps described above form the memory transistor 100.

(F) Next, as shown in FIG. 4(*b*), a layer 42 containing nitride is formed on the silicon substrate 10. The layer 42 containing nitride may be formed by, for example, a CVD method. As a concrete example of the CVD method, a thermal CVD method and a plasma CVD method may be recommended.

Next, a silicon oxide layer 44 is formed on the layer 42 containing nitride. The silicon oxide layer 44 may be formed by, for example, a CVD method. As a result, an interlayer dielectric layer 40 composed of the layer 42 containing nitride and the silicon oxide layer 44 is formed.

Next, as shown in FIG. 1, specified regions of the interlayer dielectric layer 40 are selectively etched and removed, to form a contact hole 46 that may reach the drain region 16 or the like. Then, the contact hole is filled with a conductive material (for example, tungsten) to form a contact layer 32.

Next, a conductive layer composed of aluminum or the like is deposited on the interlayer dielectric layer 40 by using, for example, a sputter method, and the conductive layer is patterned to form a wiring layer 30.

The following modifications can be possible for the first embodiment.

Figure 5:
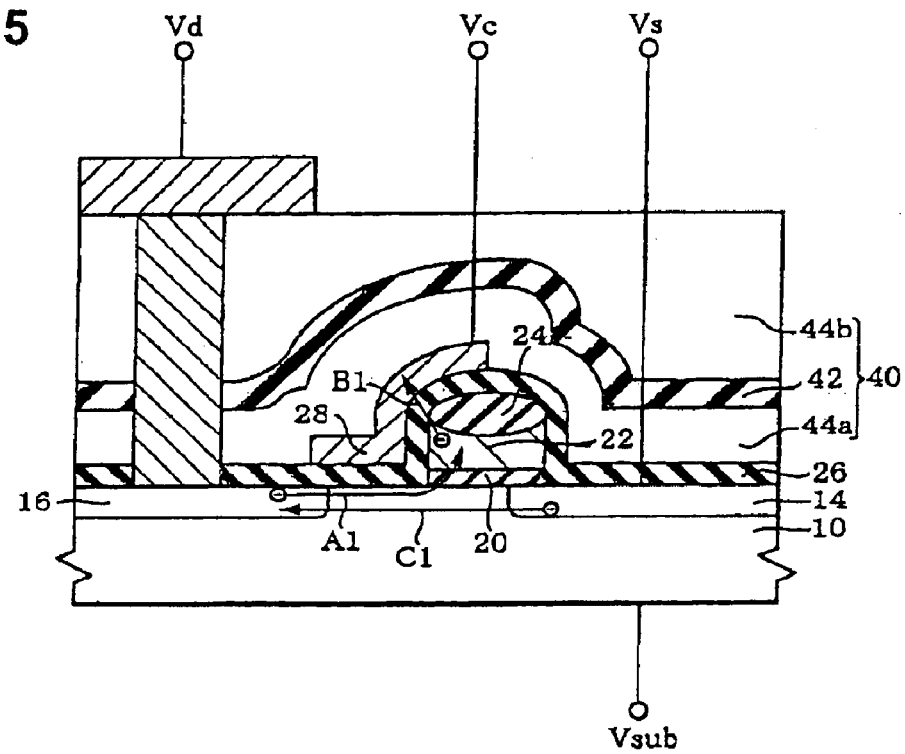
FIG. 5 shows a modified example of the semiconductor device in accordance with the first embodiment of the present invention.

(1) The layer 42 containing nitride may be provided as an intermediate layer of the interlayer dielectric layer 40, as shown in FIG. 5. More concretely, the interlayer dielectric layer 40 may be formed from a silicon oxide layer 44a, the layer 42 containing nitride and a silicon oxide layer 44b successively deposited in layers one on top of the other.

Figure 6:
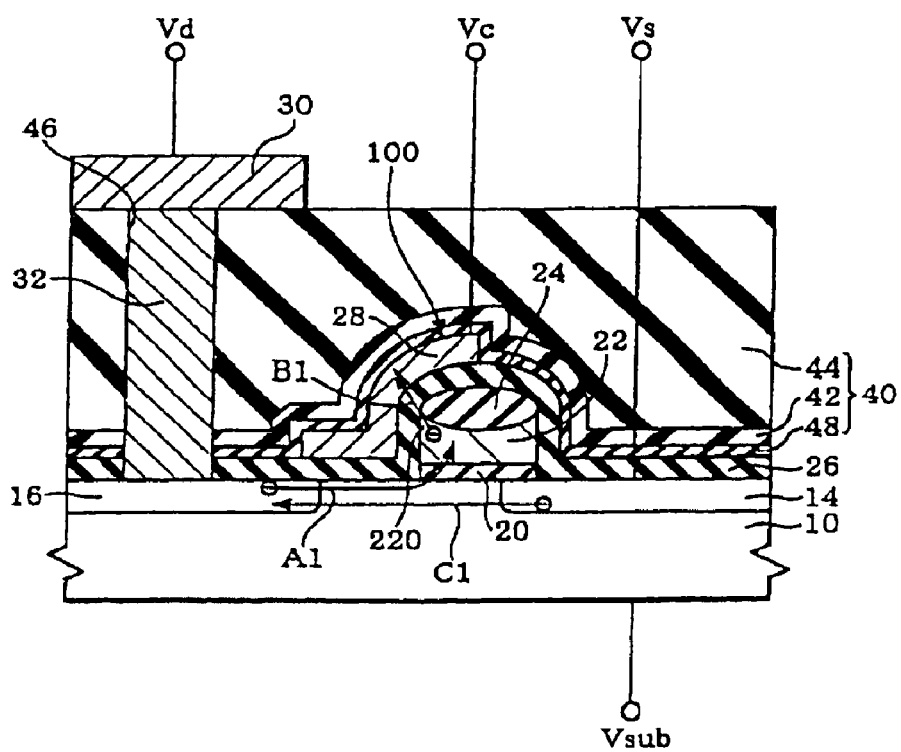
FIG. 6 shows a modified example of the semiconductor device in accordance with the first embodiment of the present invention.

(2) The layer 42 containing nitride may preferably be formed on the control gate 28 and the tunneling dielectric layer 26 through a thin silicon oxide layer 48, as shown in FIG. 6. By virtue of forming the silicon oxide layer 48, the coherency of the layer 42 containing nitride with an under layer improves, and damages to the layer 42 containing nitride can be reduced.

Here, by forming the silicon oxide layer 48 thin to a thickness of 10–80 nm, the number of etching steps for forming the contact hole 46 can be reduced compared to the modified example (1) shown in FIG. 5. In the case of the modified example (1), since the film thickness of the silicon oxide layer 44a is large, as shown in FIG. 5, each of the silicon oxide layer 44b, the layer 42 containing nitride, and silicon layer 44a among the interlayer dielectric layer 40 independently needs an etching step. In contrast, in the case of the modified example (2) shown in FIG. 6, since the silicon oxide layer is thin, which is 10–80 nm, in an etching step for the layer 42 containing nitride, the silicon oxide layer 48 can be etched by conducting an overetching. As a consequence, the number of etching steps for forming the contact hole 46 can be reduced compared to the modified example (1) shown in FIG. 5.

Furthermore, by forming the silicon oxide layer 48 to a thickness of 30–70 nm, the memory characteristic can be improved. Details thereof will be described below in the "Experimental Example 2".

Also, a film that is formed by a reduced pressure CVD method using TEOS may preferably be used as the silicon oxide layer 48. Details thereof will be described below in the "Experimental Example 3".

Figure 7:
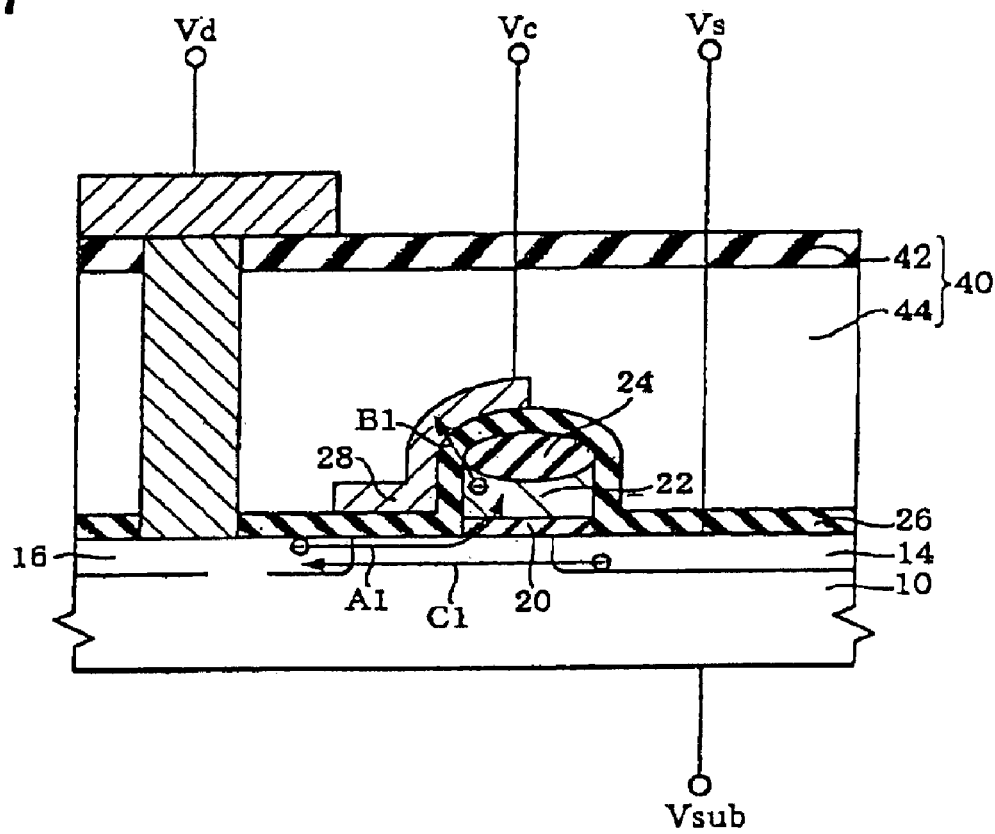
FIG. 7 shows a modified example of the semiconductor device in accordance with the first embodiment of the present invention.

(3) The layer 42 containing nitride may be provided as an uppermost layer of the interlayer dielectric layer 40, as shown in FIG. 7. More concretely, the interlayer dielectric layer 40 may be formed from a silicon oxide layer 44 and a layer 42 containing nitride successively deposited in layers one on top of the other. In this case, the interlayer dielectric layer 40 may be formed by depositing a silicon oxide layer 44 over the entire surface, then planarizing the silicon oxide layer 44 by a chemical-mechanical polishing method, and depositing a layer 42 that contains nitride.

(Second Embodiment)

Figure 8:
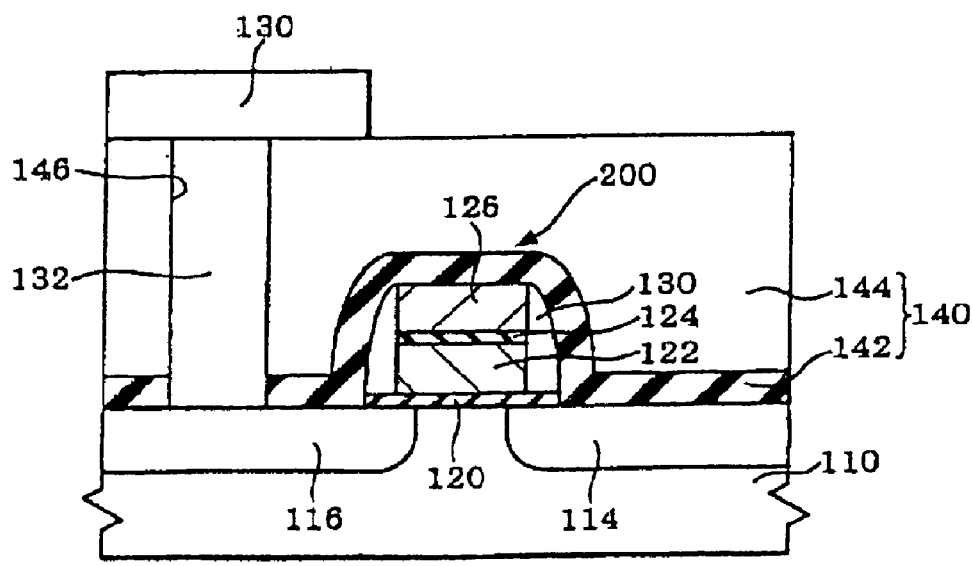
FIG. 8 schematically shows a cross-sectional view of a semiconductor device in accordance with a second embodiment of the present invention.

A semiconductor device in accordance with a second embodiment is described below. FIG. 8 schematically shows a cross-sectional view of a semiconductor device in accordance with the second embodiment of the present invention.

A non-volatile memory transistor of the second embodiment (hereafter referred to as a "memory transistor") 200 is a stacked type. More specifically, the memory transistor 200 has a gate dielectric layer 120, a source region 114, and a drain region 116. A floating gate 122, an intermediate dielectric layer 124, and a control gate 126 are successively formed on the gate dielectric layer 120. Sidewalls 130 are formed on side walls of the floating gate 122, the intermediate dielectric layer 124 and the control gate 126.

An interlayer dielectric layer 130 is formed on the silicon substrate 110. A layer 142 containing nitride is formed at a lower most layer of the interlayer dielectric layer 140. The composition of the layer 142 containing nitride may be the same as the composition of the first embodiment. A silicon oxide layer 144 is formed on the layer 142 containing nitride. In other words, the interlayer dielectric layer 140 is formed from the layer 142 containing nitride and the silicon oxide layer 144.

For example, a contact hole 146 that reaches the drain region 16 is formed in the interlayer dielectric layer 140. A contact layer 132 is formed in the contact hole 146. The contact layer 132 is formed from, for example, a tungsten plug. A wiring layer 130 having a specified pattern is formed on the contact layer 132 and the interlayer dielectric layer 140.

Effects of the semiconductor device in accordance with the present embodiment are described below.

In the present embodiment, the interlayer dielectric layer 140 includes the layer 142 containing nitride. For this reason, the non-volatile memory transistor 200 can be protected from process induced charges that are generated in various manufacturing steps after the interlayer dielectric layer 140 has been formed. Also, the dielectric layers of the memory transistor can be protected from molecules and ions of hydrogen or the like that deteriorate the dielectric layers (the gate dielectric layer and the intermediate dielectric layer) of the memory transistor. As a result, the rewritable number characteristic of the memory transistor 200 can be improved.

Figure 9:
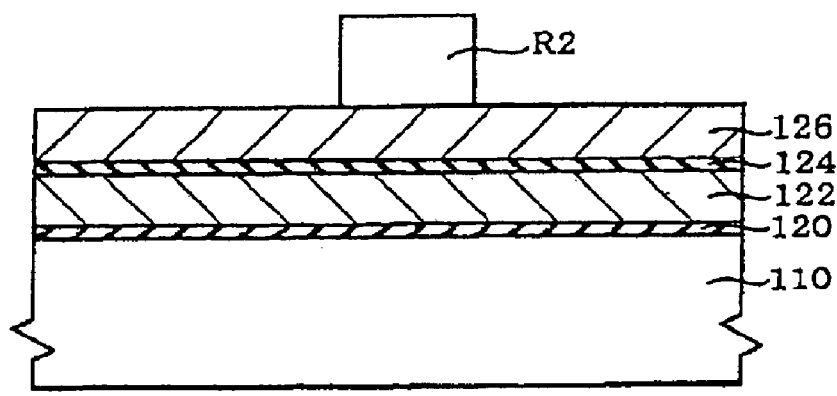
FIG. 9 shows in cross section steps of manufacturing the semiconductor device in accordance with the second embodiment of the present invention.
Figure 9:
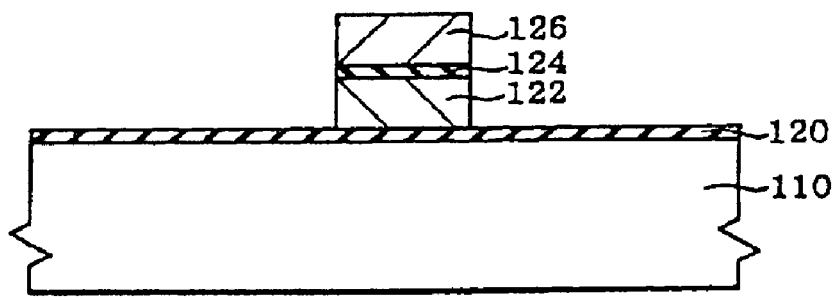
Figure 10:
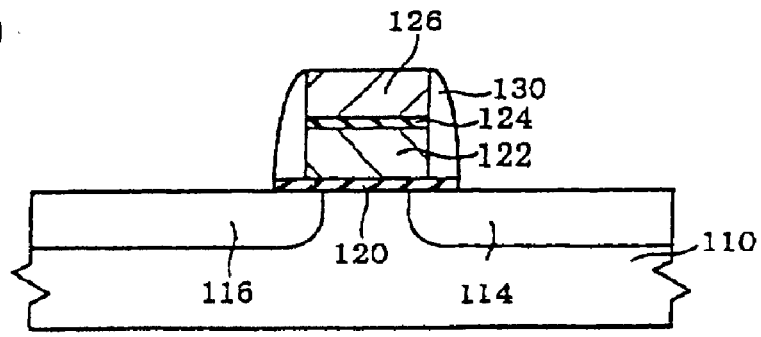
FIG. 10 shows in cross section steps of manufacturing the semiconductor device in accordance with the second embodiment of the present invention.
Figure 10:
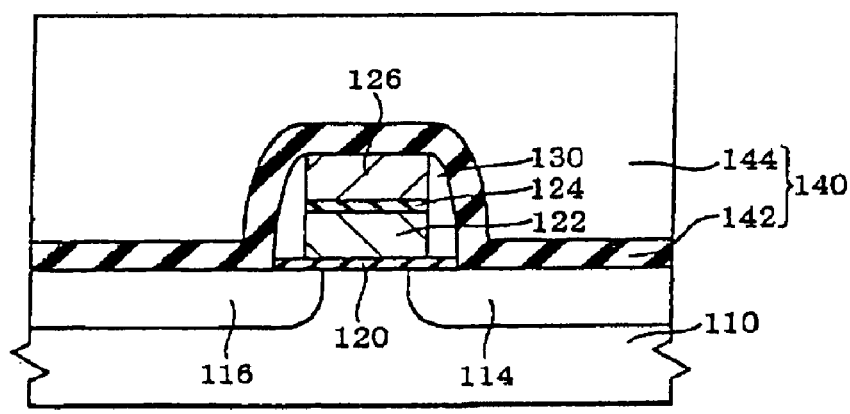

A method for manufacturing the semiconductor device in accordance with the second embodiment of the present invention will be described. FIGS. 9 and 10 schematically show cross sections of a semiconductor device in manufacturing steps in accordance with the second embodiment of the present embodiment.

(1) As shown in FIG. 9(a), a silicon oxide layer (gate dielectric layer) 120 is formed on a surface of the silicon substrate 110. The silicon oxide layer 120 may preferably be formed by, for example, a thermal oxidation method. The silicon oxide layer 120 is not limited to a particular thickness, but may have a thickness of, for example, 6–14 nm in view of the gate dielectric strength, the data retaining characteristic and the like.

Next, a polysilicon layer 122 for a floating gate is formed on the silicon oxide layer 120. The polysilicon layer 122 may be formed by, for example, a CVD method. The polysilicon layer 122 may preferably have a thickness of, for example, 10–20 nm, for example.

Next, an intermediate dielectric layer 124 is formed on the polysilicon layer 122. The intermediate dielectric layer 124 may be formed from, for example, a silicon oxide layer, or an ONO film. The intermediate dielectric layer 124 is formed by, for example, a CVD method. The thickness of the intermediate dielectric layer 124 is, for example, 20–30 nm.

Next, a polysilicon layer 126 for a control gate is formed on the intermediate dielectric layer 124. The polysilicon layer 126 may be formed by, for example, a CVD method. The thickness of the polysilicon layer 126 is, for example, 20–40 nm.

Next, a resist layer R2 having a specified pattern is formed on the polysilicon layer 126. Then, as shown in FIG. 9(b), the polysilicon layer 126, the intermediate dielectric layer 124 and the polysilicon layer 122 are selectively etched, using the resist layer R2 as a mask. Then, the resist layer R2 is removed.

Next, as shown in FIG. 10(a), sidewalls 130 are formed on side walls of the polysilicon layer (control gate) 126, the intermediate dielectric layer 124 and the polysilicon layer (floating gate) 122. For example, the sidewalls 130 can be formed in the following manner. A silicon oxide layer (not shown) is formed over the entire surface by a CVD method. Then, the silicon oxide layer is anisotropically etched by a reactive ion etching or the like to form the sidewalls 130. Also, after the silicon oxide layer is etched, the silicon oxide layer 120 on the silicon substrate 110 is also etched.

Next, an impurity is ion implanted in the silicon substrate 110 to form source and drain regions 114 and 116.

Next, as shown in FIG. 10(b), a layer 142 containing nitride is formed over the entire surface. The layer 142 containing nitride may be formed in the same manner as the first embodiment.

Next, a silicon oxide layer 144 is formed on the layer 142 containing nitride. In this manner, an interlayer dielectric layer 140 that is composed of the layer 142 containing nitride and the silicon oxide layer 144 is formed. Next, depending on the requirements, the interlayer dielectric layer 140 is planarized by, for example, a chemical-mechanical polishing method.

Next, as shown in FIG. 8, using a lithography technique, the interlayer dielectric layer 140 is selectively etched to form a through hole 146. Next, the through hole 146 is filled with a conductive material to form a contact layer 132. Next, a wiring layer 130 that is electrically connected to the contact layer 132 is formed on the interlayer dielectric layer 140.

The following modifications can be possible for the first embodiment.

Figure 11:
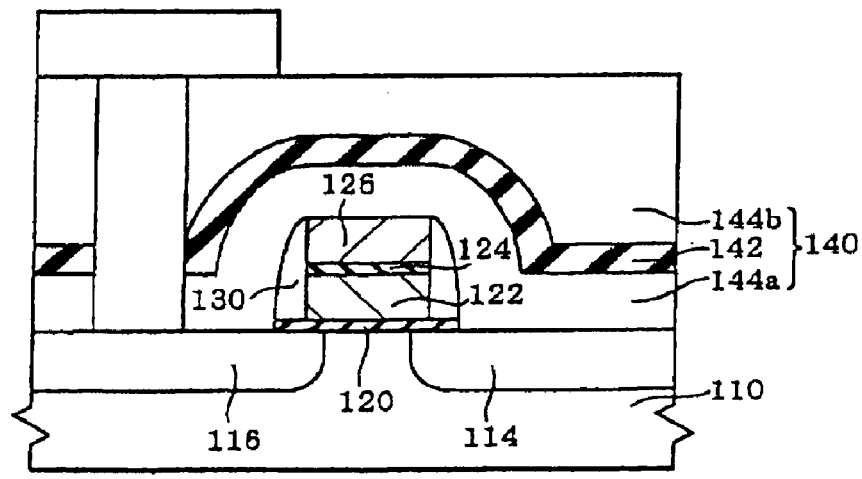
FIG. 11 shows a modified example of the semiconductor device in accordance with the second embodiment of the present invention.

(1) The layer 142 containing nitride may be provided as an intermediate layer of the interlayer dielectric layer 140, as shown in FIG. 11. More concretely, the interlayer dielectric layer 140 may be formed from a silicon oxide layer 144a, the layer 142 containing nitride and a silicon oxide layer 144b successively deposited in layers one on top of the other.

Figure 12:
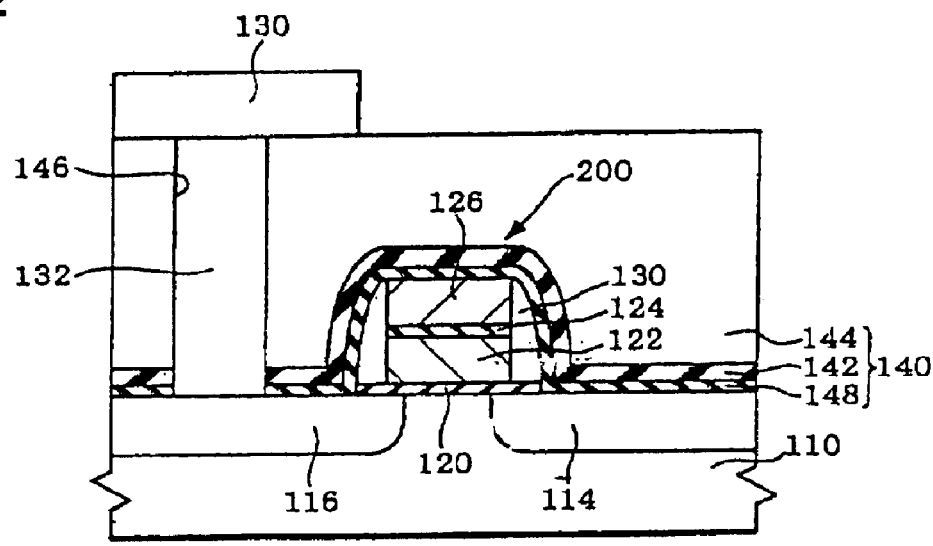
FIG. 12 shows a modified example of the semiconductor device in accordance with the second embodiment of the present invention.

(2) The layer 142 containing nitride may preferably be formed on the under layer through a thin silicon oxide layer 148, as shown in FIG. 12. By virtue of forming the silicon oxide layer 148, the coherency of the layer 42 containing nitride with the under layer improves, and damages to the layer 142 containing nitride can be reduced. The thickness of the silicon oxide layer 148 is, for example 10–30 nm.

As a result of forming the silicon oxide layer 140 thin to a thickness of 10–30 nm, the same effects as those of the modified example (2) of the first embodiment can be obtained.

Figure 13:
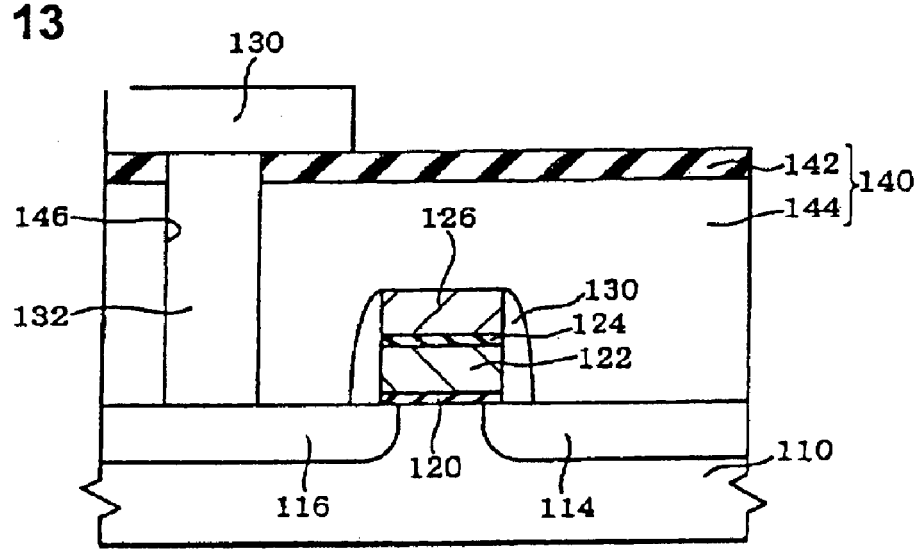
FIG. 13 shows a modified example of the semiconductor device in accordance with the second embodiment of the present invention.

(3) The layer 42 containing nitride may be provided as an uppermost layer of the interlayer dielectric layer 140, as shown in FIG. 13. More concretely, the interlayer dielectric layer 140 may be formed from a silicon oxide layer 144 and a layer 142 containing nitride successively deposited in layers. In this case, the interlayer dielectric layer 140 may be formed by depositing a silicon oxide layer 144 over the entire surface, then planarizing the silicon oxide layer 144 by a CMP method, and depositing a layer 142 that contains nitride.

EXPERIMENTAL EXAMPLE 1

Differences in the memory characteristics are examined between the case where a silicon nitride layer is formed at the lower most layer of the interlayer dielectric layer (the embodiment example) and the case where a silicon nitride layer is not formed. The characteristics examined are three characteristics, which are FTV (Forward Tunnel Voltage), FTUR (Forward Trap Up Rate) and the rewritable number (Endurance). It is noted that non-volatile memory transistors in memory cells in the embodiment and the comparison example are a split-gate type. Also, the non-volatile memory transistors in memory cells of the embodiment example and the non-volatile memory transistors in memory cells of the comparison example are formed under the same conditions. An interlayer dielectric layer of the embodiment example is formed by successively depositing a silicon nitride layer and a silicon oxide layer. The thickness of the silicon nitride layer of the embodiment example is 50 nm. The silicon nitride layer is formed by a CVD method. An interlayer dielectric layer of the comparison example is formed solely from a silicon oxide layer.

Figure 14:
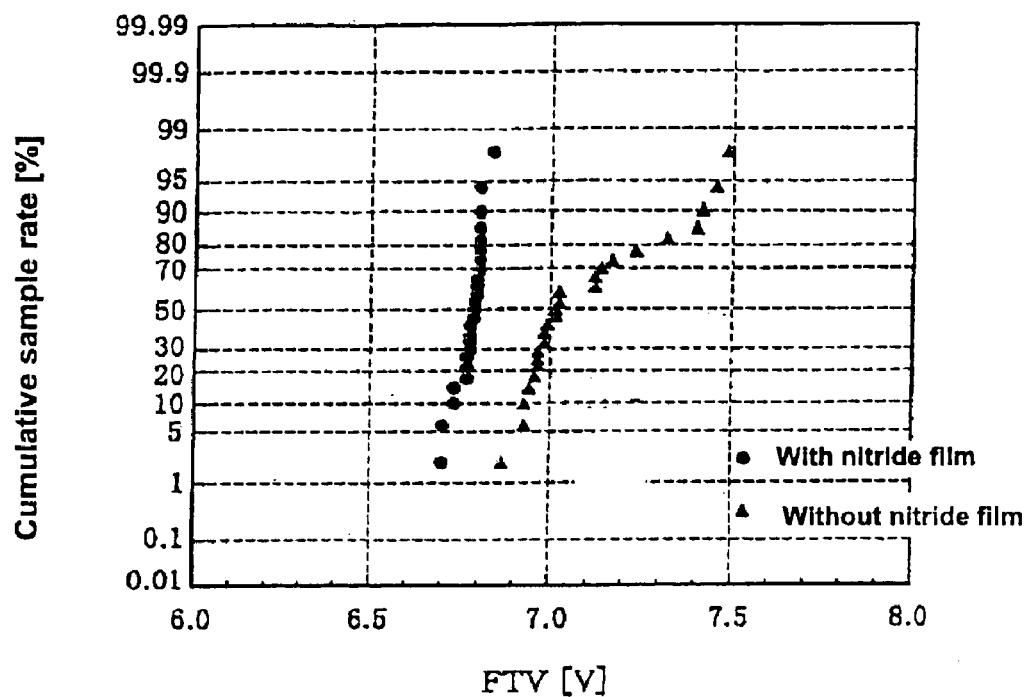
FIG. 14 shows a graph indicating relations between FTV and the cumulative sampling rate.

FIG. 14 is a graph showing relations between FTV and cumulative sample rate (Cumulative Percent). FTV means a voltage, among voltages needed to flow a specified reference current between a floating gate and a control gate, which is given immediately after the reference current starts flowing, i.e., after $T_1(s)$. It is noted that, in the present experimental examples, the reference current is set at 10 nA, and $T_1=0.1$ s. Also, 25 memory chip samples are prepared for each of the embodiment example and the comparison example.

Also, the cumulative sample rate is a probability plot of the entire samples. For example, in FIG. 14, one plot of the comparison example is present at a cumulative sample rate of 50% and FTV of 7.0V. This means to indicate that 50% of the entire 25 samples of the comparison example have FTV that is 7.0V or below.

It is understood from FIG. 14 that the values of FTV of the embodiment example are lower than the values of FTV of the comparison example. The lower the value of FTV, the better the erasing efficiency becomes. Therefore, it is understood that the embodiment example is excellent in the erasing efficiency compared to the comparison example.

Also, in the case of the embodiment example, the degree of variations of FTV is low compared to the comparison example. In other words, the inclination of the graph for the embodiment example is greater than the inclination of the graph for the comparison example. The lower the degree of variations of FTV, the better the characteristic stability becomes. In other words, the greater the inclination of the graph, the better the characteristic stability becomes. Accordingly, in the case of the embodiment example, its characteristic stability is good compared to the case of the comparison example.

Figure 15:
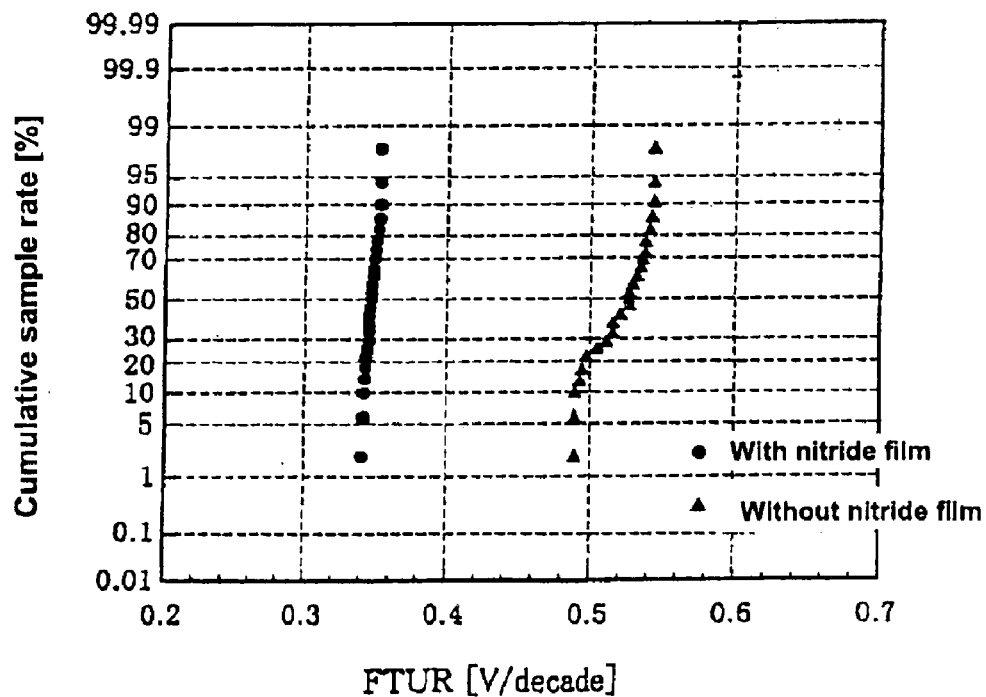
FIG. 15 shows a graph indicating relations between FTUR and the cumulative sampling rate.

FIG. 15 is a graph indicating relations between FTUR and the cumulative sample rate. It is noted that 25 memory chip samples are prepared for each of the embodiment example and the comparison example. Here, FTRU means a rate of potential change that appears when a specified reference current is flown for a predetermined period of time. More concretely, when a voltage given immediately after the reference current starts flowing, i.e., after $T_1$ (s), in other words, FTV is $V_1(V)$, and a voltage given after a specified period of time $T_2$ (s) has passed after the reference current starts flowing is $V_2$ (V), FTUR may be given by the following expression.

$$FTUR=(V_2-V_1)/(\log_{10}T_2-\log_{10}T_1) \qquad (1)$$

It is noted that, in the experimental examples, the reference current is 10 nA, $T_1=0.1$ s, and $T_2=5.0$ s. Further, 25 memory chip samples are prepared for each of the embodiment example and the comparison example.

It is understood from FIG. 15 that the values of FTUR of the embodiment example are lower than the values of FTUR of the comparison example. Lower values of the FTUR indicate that electrons are more difficult to be trapped by the tunneling dielectric layer. Therefore, it can be said that, in the case of the embodiment example, electrons are more difficult to be trapped by the tunneling dielectric layer compared to the case of the comparison example.

Also, FTUR of the embodiment example has a fewer deviations compared to the case of the comparison example. In other words, the inclination of the graph for the embodiment example is greater than the inclination of the graph for the comparison example. The lower the degree of variations of FTUR, the better the characteristic stability becomes. In other words, the greater the inclination of the graph, the better the characteristic stability becomes. Accordingly, it can be said that the embodiment example is excellent in its characteristic stability compared to the case of the comparison example. It is noted that the unit of FTUR shown in FIG. 15 is "V/decade".

Figure 16:
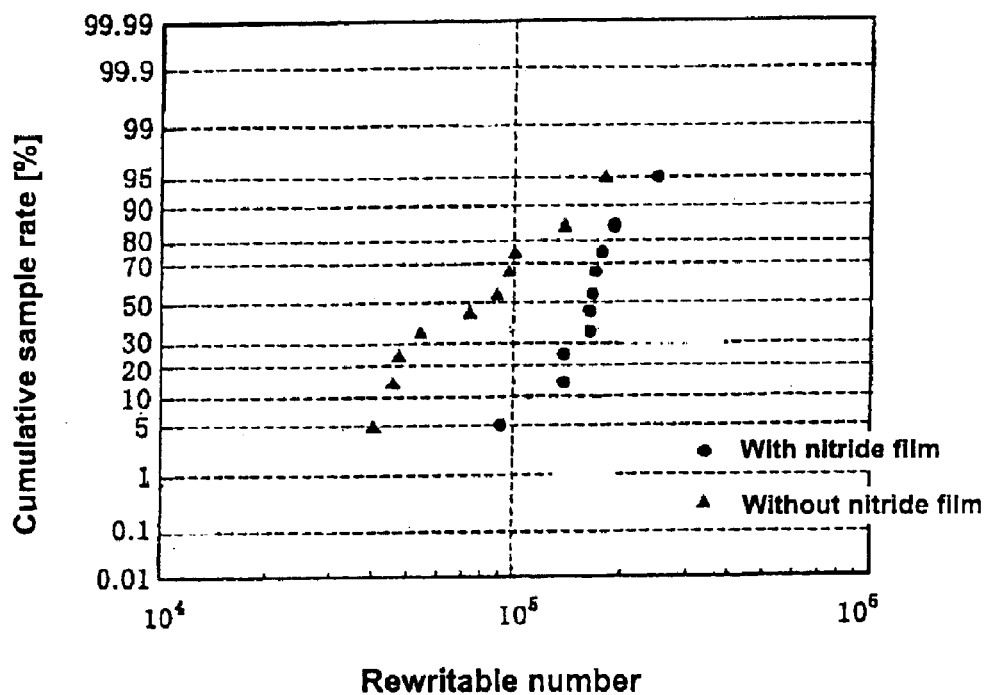
FIG. 16 shows a graph indicating relations between the rewritable number and the cumulative sampling rate.

FIG. 16 is a graph indicating relations between the rewritable number (Endurance) and the cumulative sample rate. Here, the rewritable number means the number of rewriting operations that take place until the cell current value becomes 50% of an initial value. It is noted that 10 memory chip samples are prepared for each of the embodiment example and the comparison example.

It is understood from FIG. 16 that, in the case of the embodiment example, its rewritable number improves at the same cumulative sample rate compared to the comparison example.

EXPERIMENTAL EXAMPLE 2

Relations between the film thickness of the silicon oxide layer 48 and the memory characteristics are examined in the embodiment shown in FIG. 6. In this experimental example, the silicon oxide layer is formed by a reduced CVD method using TEOS.

Figure 17:
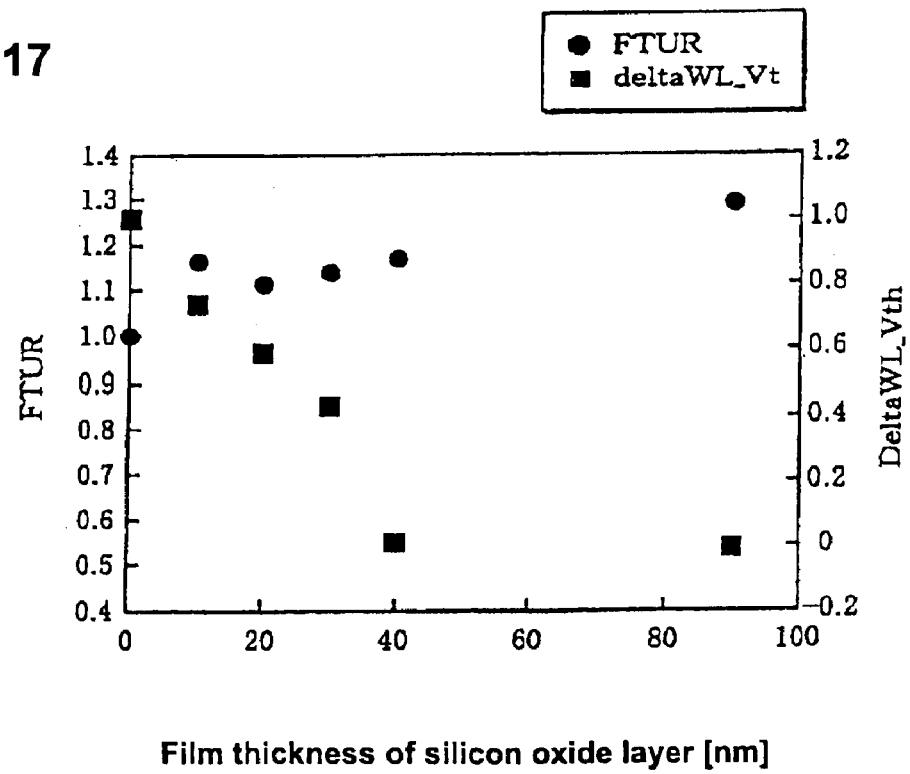
FIG. 17 shows a graph indicating relations between silicon oxide layers and FTUR, and between silicon oxide layers and Delta WL-Vth.
Figure 18:
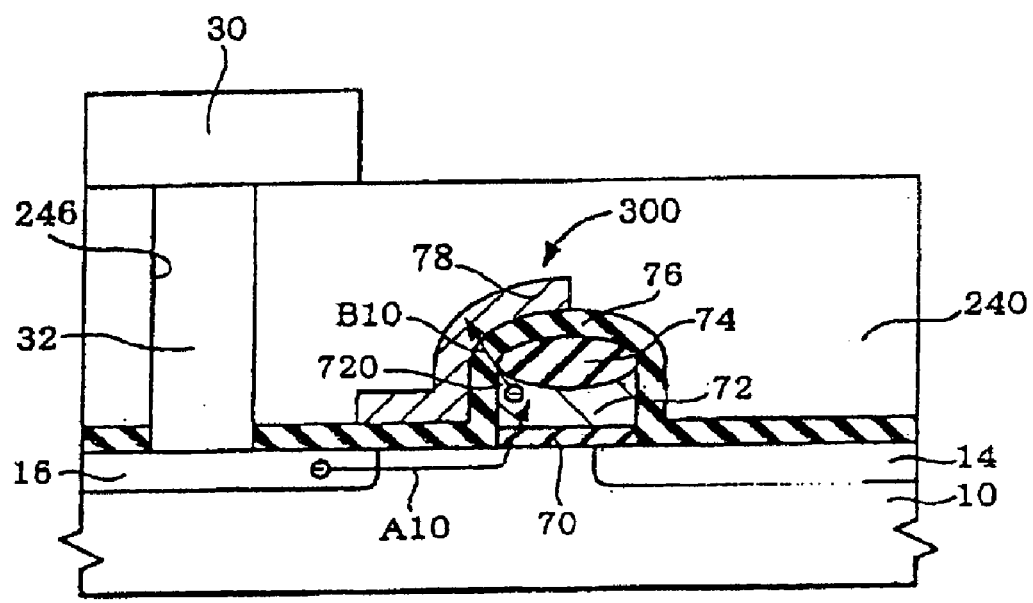
FIG. 18 schematically shows a cross-sectional view of a conventional example of a semiconductor device.

FIG. 17 is a graph indicating how values of FTUR and WL-Vth change depending on the film thickness of the silicon oxide layer formed at the lower most layer of the interlayer dielectric layer. WL-Vth indicates a threshold voltage on the control gate 28 after data is erased in the memory transistor 100 shown in FIG. 6. Delta WL-Vth means the amount of change in the threshold voltage with respect to each structure that is not provided with the silicon oxide layer 48 but provided directly with the silicon layer 42 containing nitride. Lower values in Delta WL-Vth indicate smaller amounts of change in the threshold voltage, and therefore Delta WL-Vth serves as an index to measure the stability of memory characteristic. It is noted that, in FIG. 17, measured FTRU values and Delta WL-Vth values are standardized and plotted on the graphs with a case in which the silicon oxide layer 48 is not provided and the silicon layer 42 containing nitride is directly provided being a reference (1.0).

Referring to FIG. 17, Delta WL-Vth values sharply drop when the silicon oxide film becomes 30 nm or greater. Accordingly, in order to inhibit amounts of change in the threshold voltage on the control gate and stabilize the memory characteristic, the silicon oxide film may preferably be set at a film thickness of 30 nm or greater. On the other hand, with respect to FTUR, its value is 1.2 or lower when the film thickness becomes 70 nm or lower. The comparative value of 1.2 is equivalent to an absolute value of 0.6 (V/decade) as converted, wherein, when the value is 0.6 or lower, the rewritable number required for a memory can be maintained. This means that, when the film thickness is 70 nm or less, the required rewritable number can be maintained.

In this manner, by controlling the silicon oxide film to a film thickness of 30–70 nm, the characteristics required in view of the rewritable number can be maintained, and the memory characteristic can be stabilized while inhibiting amounts of change in the threshold voltage on the control gate.

EXPERIMENTAL EXAMPLE 3

In here, in the embodiment shown in FIG. 6, Delta WL-Vth values obtained when a silicon oxide layer that is formed by a reduced CVD method using TEOS (hereafter referred to as "PL-TEOS layer") is used as the silicon oxide layer 48 are compared with Delta WL-Vth values obtained when a silicon oxide layer that is formed by a plasma CVD method (hereafter referred to as "P-TEOS layer") is used as the silicon oxide layer 48. It is noted that experimental samples adopted for both of the LP-TEOS layer and P-TEOS layer have a film thickness 50 nm, but other structures are the same with one another. The following result is obtained.

(Delta WL-Vth when LP-TEOS layer is used)/(Delta WL-Vth when L-TEOS layer is used)=0.686

In view of the above, when an LP-TEOS layer is used as the silicon oxide layer 48, the amount of changes in the threshold voltage on the control gate can be inhibited by about 30% compared to the case in which a P-TEOS layer is used, and therefore a more stabilized memory characteristic can be obtained.

The present invention is not limited to the embodiments described above, and many modifications can be made without departing from the subject matter of the invention.

For example, an interlayer dielectric layer having the structure of the present invention can be formed not only in memory regions where non-volatile memory transistors are formed, but also in peripheral circuit regions where logical circuits or the like are formed. Also, MOS transistors may be used as memory transistors.

What is claimed is:

1. A semiconductor device having a non-volatile memory transistor formed on a semiconductor layer, the semiconductor device comprising:
   an interlayer dielectric layer provided over the semiconductor layer and the non-volatile memory transistor with the interlayer dielectric layer being in direct contact with a component of the non-volatile memory transistor,
   a wiring layer provided on and in direct contact with the interlayer dielectric layer,
   wherein the interlayer dielectric layer includes a first oxide film provided as a lowermost layer of the interlayer dielectric layer, a layer containing nitride provided on and in direct contact with the first oxide film, a second oxide film provided on and in direct contact with the layer containing nitride, the first oxide film is an oxide film that is formed by a reduced pressure CVD method using TEOS, and the first oxide film has a thickness of 30–70 nm.

2. A semiconductor device having a non-volatile memory transistor formed on a semiconductor layer, the semiconductor device comprising:
   an interlayer dielectric layer provided over the semiconductor layer and the non-volatile memory transistor,
   a wiring layer provided on and in direct contact with the interlayer dielectric layer,
   wherein the interlayer dielectric layer comprises a first oxide film provided as a lowermost layer of the interlayer dielectric layer, a layer containing nitride provided on and in direct contact with the first oxide film, a second oxide film provided on and in direct contact with the layer containing nitride, the first oxide film is an oxide film that is formed by a reduced pressure CVD method using TEOS, and the first oxide film has a thickness of 30–70 nm.

3. A semiconductor device having a non-volatile memory transistor formed on a semiconductor layer, the semiconductor device comprising:
   an interlayer dielectric layer provided over the semiconductor layer and the non-volatile memory transistor with the interlayer dielectric layer being in direct contact with a component of the non-volatile memory transistor; and
   a wiring layer provided on and in direct contact with the interlayer dielectric layer,
   wherein the interlayer dielectric layer includes a first oxide film provided as a lowermost layer of the interlayer dielectric layer, a layer containing nitride provided on and in direct contact with the first oxide film, a second oxide film provided on and in direct contact with the layer containing nitride, the first oxide film is an oxide film that is formed by a reduced pressure CVD method using TEOS, and the first oxide film has a thickness of 30–70 nm.

4. A semiconductor device having a non-volatile memory transistor formed on a semiconductor layer, the semiconductor device comprising:
   an interlayer dielectric layer provided over the semiconductor layer and the non-volatile memory transistor; and
   a wiring layer provided on and in direct contact with the interlayer dielectric layer,
   wherein the interlayer dielectric layer comprises a first oxide film provided as a lowermost layer of the interlayer dielectric layer, a layer containing nitride provided on and in direct contact with the first oxide film, a second oxide film provided on and in direct contact with the layer containing nitride, the first oxide film is an oxide film that is formed by a reduced pressure CVD method using TEOS, and the first oxide film has a thickness of 30–70 nm.

5. A semiconductor device having a non-volatile memory transistor formed on a semiconductor layer, the semiconductor device comprising:
   an interlayer dielectric layer provided over the semiconductor layer and the non-volatile memory transistor; and
   a wiring layer provided on and in direct contact with the interlayer dielectric layer,
   wherein the interlayer dielectric layer comprises a first oxide film provided as a lowermost layer of the interlayer dielectric layer, a layer containing nitride provided on and in direct contact with the first oxide film, a second oxide film provided on and in direct contact with the layer containing nitride, the first oxide film has a thickness of 30–70 nm, and the first oxide film is an oxide film that is formed by a reduced pressure CVD method using TEOS.

* * * * *